United States Patent
Nakamura (10) Patent No.: US 9,929,370 B2
(45) Date of Patent: Mar. 27, 2018

(54) ORGANIC EL DISPLAY

(71) Applicant: UNIFIED INNOVATIVE TECHNOLOGY, LLC, Wilmington, DE (US)

(72) Inventor: Hideyo Nakamura, Matsumoto (JP)

(73) Assignee: UNIFIED INNOVATIVE TECHNOLOGY, LLC, Wilmington, DE (US)

( * ) Notice: Subject to any disclaimer, the term of this patent is extended or adjusted under 35 U.S.C. 154(b) by 0 days.

(21) Appl. No.: 15/063,008

(22) Filed: Mar. 7, 2016

(65) Prior Publication Data

US 2016/0190508 A1  Jun. 30, 2016

(51) Int. Cl.
| | |
|---|---|
| H01L 35/24 | (2006.01) |
| H01L 51/00 | (2006.01) |
| H01L 51/52 | (2006.01) |
| H01L 27/32 | (2006.01) |

(52) U.S. Cl.
CPC ........ *H01L 51/5234* (2013.01); *H01L 27/322* (2013.01); *H01L 27/3246* (2013.01);
(Continued)

(58) Field of Classification Search
CPC .............. H01L 27/322; H01L 27/3246; H01L 51/0005; H01L 51/5203; H01L 2251/5315; H01L 51/5228
See application file for complete search history.

(56) References Cited

U.S. PATENT DOCUMENTS

| | | |
|---|---|---|
| 5,701,055 A | 12/1997 | Nagayama et al. |
| 5,952,037 A | 9/1999 | Nagayama et al. |

(Continued)

FOREIGN PATENT DOCUMENTS

| | | |
|---|---|---|
| CN | 1329458 A | 1/2002 |
| CN | 1797781 A | 7/2006 |

(Continued)

OTHER PUBLICATIONS

International Preliminary Report on Patentability dated Jun. 21, 2012, directed to International Application No. PCT/JP2009/006171; 8 pages.

(Continued)

*Primary Examiner* — Meiya Li
(74) *Attorney, Agent, or Firm* — Birch, Stewart, Kolasch & Birch, LLP (57) ABSTRACT

An organic electro-luminescent (EL) display can have a reduced optical loss and high efficiency, and can be manufactured by an inexpensive method. The organic EL display can be formed by bonding an organic EL element substrate including a substrate, reflective electrode, organic EL layer, separation wall, barrier layer, transparent electrode, and color conversion layer; and a sealing substrate together, wherein: the reflective electrode includes a plurality of partial electrodes; the organic EL layer is formed on the reflective electrode and includes a plurality of parts separated by the separation wall; the transparent electrode is formed on the organic EL layer; the barrier layer covers the separation wall and the transparent electrode, and has a recessed part in a location corresponding to the reflective electrode; and the color conversion layer is formed in the recessed part.

18 Claims, 7 Drawing Sheets

(52) U.S. Cl.
CPC ...... *H01L 51/5203* (2013.01); *H01L 51/5218* (2013.01); *H01L 51/5228* (2013.01); *H01L 51/5253* (2013.01); *H01L 51/0005* (2013.01); *H01L 51/525* (2013.01); *H01L 2251/5315* (2013.01)

(56) References Cited

U.S. PATENT DOCUMENTS

| | | |
|---|---|---|
| 2005/0062407 A1 | 3/2005 | Suh et al. |
| 2005/0077816 A1* | 4/2005 | Yamada .............. H01L 51/5228 313/503 |
| 2005/0093435 A1 | 5/2005 | Suh et al. |
| 2005/0263775 A1 | 12/2005 | Ikeda et al. |
| 2006/0012288 A1 | 1/2006 | Terakado et al. |
| 2006/0125389 A1 | 6/2006 | Song et al. |
| 2006/0170340 A1 | 8/2006 | Tzen et al. |
| 2007/0023734 A1 | 2/2007 | Igarashi et al. |
| 2007/0145892 A1 | 6/2007 | Chen |
| 2007/0201056 A1 | 8/2007 | Cok et al. |
| 2008/0143255 A1 | 6/2008 | Lee et al. |
| 2009/0009069 A1 | 1/2009 | Takata |
| 2009/0015153 A1 | 1/2009 | Asano |
| 2009/0278450 A1 | 11/2009 | Sonoyama et al. |
| 2012/0228603 A1 | 9/2012 | Nakamura |

FOREIGN PATENT DOCUMENTS

| | | |
|---|---|---|
| CN | 101340754 A | 1/2009 |
| EP | 1 670 085 A1 | 6/2006 |
| JP | 2004-14532 | 1/2004 |
| JP | 2005-93398 | 4/2005 |
| JP | 2005-100939 A | 4/2005 |
| JP | 2006-4917 A | 1/2006 |
| JP | 2006-32010 | 2/2006 |
| JP | 2007-19487 | 1/2007 |
| JP | 2007-234572 A | 9/2007 |
| JP | 2008-78038 | 4/2008 |
| JP | 2008-135325 | 6/2008 |
| JP | 2008-525977 | 7/2008 |
| JP | 2008-204757 | 9/2008 |
| JP | 2009-32673 | 2/2009 |
| JP | 2009-164117 | 7/2009 |
| TW | 200716721 A | 5/2007 |
| TW | 200829069 A | 7/2008 |
| WO | WO 2011/061789 A1 | 5/2011 |

OTHER PUBLICATIONS

Search Report dated Jan. 12, 2010, directed to International Application No. PCT/JP2009/006171; 2 pages.

* cited by examiner

ORGANIC EL DISPLAY

REFERENCE TO RELATED APPLICATIONS

This application is a Divisional of copending U.S. application Ser. No. 13/510,485 filed on May 17, 2012, which was filed as the National Phase of PCT International Application No. PCT/JP2009/006171, filed Nov. 17, 2009, all of which are hereby expressly incorporated by reference into the present application.

BACKGROUND OF THE INVENTION

Field of the Invention

The present invention mainly relates to an organic electroluminescent (EL) display.

Discussion of the Background Art

A panel unit of an organic EL display having a top emission structure typically has a configuration in which an organic EL element substrate (a Thin-Film transistor: TFT substrate) and a color filter substrate are bonded together.

An organic EL element substrate having a conventional structure includes, for example, a glass substrate, a TFT structure, planarizing resin, an inorganic passivation film that may be optionally provided, an underlying layer for enhancing adhesiveness, reflective electrodes, an insulating film that has openings in locations serving as light emitting parts, an organic EL layer, a transparent electrode (including semitransparent one), and a barrier layer that covers a structure including and below the transparent electrode within a display area, in this order. The transparent electrode is connected to wiring in a circumferential edge part of the organic EL element substrate.

On the other hand, a color filter substrate having a conventional structure includes, for example, a glass substrate, black matrix, color filters, and color conversion layers that may be optionally provided, in this order. As a method for forming the color filters and/or color conversion layers, in addition to a conventional photolithography method, an application (coating) method such as an inkjet method is also becoming widely used. In the case of using the application method to form plural kinds of color filters and/or color conversion layers, it is common to use a separation wall to selectively form each of the color filters and/or color conversion layers in a desired location.

Finally, an organic EL display is obtained by bonding the organic EL element substrate and the color filter substrate together while opposing the light emitting parts of the organic EL element substrate against the color filters of the color filter substrate with registering. The bonding can be performed by a method such as a vacuum dripping bonding method that is commonly used for liquid crystal display manufacturing. In order to highly efficiently transmit light from the organic EL element substrate side to the color filter substrate side and keep mechanical strength, filler such as an adhesive may be enclosed in a bonding gap. If accurate control of the bonding gap between the organic EL element substrate and the color filter substrate is desired, spacers can be provided on the color filter, or the like. If the bonding gap is too wide, a crosstalk problem that light penetrates into an adjacent pixel is concerned. On the other hand, if the bonding gap is too narrow, influence of interference, mechanical contact between the organic EL element substrate and the color filter substrate in the display area, and the like are concerned. In particular, in the case of enclosing the filler in the bonding gap, if the bonding gap is too narrow, the included filler may distribute unevenly.

For example, in the case of forming the color conversion layer by an application method using a bank, the color conversion layer is formed by forming a separation wall having a desired shape and applying color conversion layer-forming ink with use of an inkjet device or the like in the state that a processing surface, on which the separation wall has been formed, faces upward, to form the color conversion layer. The color conversion layer-forming ink is generally prepared by dissolving or dispersing a color converting material into a solvent. An ink droplet just after the application has a raised shape to the extent that it protrudes from an upper part of the separation wall. Then, by heat-drying the ink droplet, a planar layer is formed in the bottom of the separation wall. Usually, by repeating the application and heat-drying a plurality of times, the color conversion layer having a desired film thickness is obtained.

In this case, the separation wall is required to have a height of about 3 to 7 μm in order to prevent an ink droplet from leaking at the time of the application. Such a height cannot be ignored as compared with a sub pixel size of about 40 to 60 μm in a display having a resolution of 200 to 150 ppi, and thereby the efficiency may be reduced by increase of a ratio of emitted light that does not enter the color conversion layer of a predetermined sub pixel but deviates transversely. In addition, in the case where the transversely deviated light enters an adjacent different color sub pixel, the color conversion layer of the adjacent sub pixel may emit converted light and the emitted light may produce undesired hue.

Further, the thin-film organic EL layer has extremely low mechanical strength. Therefore in the organic EL display employing the bonding structure as described above, mechanical bonding strength in the display area cannot be expected at all. For this reason, concern on film peeling due to heat shock or impact applied when used, shrinkage by curing at the time of solidifying the enclosed filler, or the like is inherent in a large-screen bonding-type organic EL display, even if a whole of the display area is bonded by filling the adhesive into the bonding gap. Also, a structure involving a hollow bonding gap has been proposed by many institutions from the start time of the organic EL display; however, it goes without saying that such a structure is not advantageous to manufacturing of the large screen display.

In addition, in the top emission type organic EL display in which the organic EL layer is formed by a vapor deposition, the barrier layer for protecting the organic EL layer is substantially essential. However, in the case where the structure in which the filler is enclosed in the bonding gap is adopted and the filler has a lower refractive index than that of the barrier layer, total reflection occurs at an interface between the barrier layer and the filler, preventing sufficient amount of light from being transmitted, and therefore resulting in an optical loss. For example, SiN or the like that is commonly used for the barrier layer has a refractive index of about 1.7 to 1.9. On the other hand, the types of resins having a higher refractive index than this are very few, and therefore a range of filler selection is narrowed to constrain a manufacturing method. In addition, such filler is a special and expensive material, and therefore becomes a factor for increasing manufacturing cost. Meanwhile, in the case of forming the barrier layer with use of a material such as SiO having a refractive index of about 1.5 in order to conform the refractive index to that of typical resin, reflection at the interface between the barrier layer and the filler is reduced, but a large loss occurs in light on the way from the organic EL layer and transparent electrode to the barrier layer. This is because the organic EL layer and the transparent electrode typically have reflective indices of about 2, respectively.

As a method for solving the optical loss caused by the filler enclosed in the bonding gap as described above, Japanese Patent Laid-Open No. 2006-32010 proposes a structure in which a forward tapered shaped insulating film for separating a cathode is used as a separation wall on which an organic EL layer, transparent anode, and protective layer are formed, and on the protective layer, a color filter and/or color conversion layer is formed (see PTL 1). In this structure, the insulating film used as a bank and the organic EL layer of a light emitting part are joined to each other throughout a whole screen. Here, the insulating film that is formed of an organic material and extremely thick as compared with the other layers contains a large amount of outgas such as moisture. An amount of outgas transmitted through the insulating film increases because the film thickness is large. In a state where the insulating film and the organic EL layer are joined to each other throughout the whole screen, the outgas is easily transmitted from the insulating film to the organic EL layer, which may cause an area called as a dark spot or dark area to be spread in a short period of time. Further, Japanese Patent Laid-Open No. 2006-32010 does not disclose sealing based on substrate bonding; however, the sealing is practically required. Therefore, as described above, there is a concern on insufficient mechanical strength due to the thin film organic EL layer.

In addition, it is necessary to consider the transmission of the outgas or solvent through the protective layer. Even if taking countermeasures against the insulating film used as the bank (more stringent heat treatment condition at the time of forming the insulating film, or the formation of the insulating film with an inorganic material), continuity of the organic EL layer over the whole display area, per se, may cause broad area transmission of the outgas that penetrates through the protective layer. In particular, in the case of applying a color converting material on the protective layer to form the color conversion layer by a wet process such as an inkjet method, the organic EL layer is significantly damaged by a component penetrating through the protective layer. This is because it is necessary to dilute the color converting material down to 1 to a few % with an organic solvent that significantly damages the organic EL layer in the formation of the color conversion layer by the wet process. This situation is tantamount to applying the solvent on the organic EL layer and protective layer, therefore dramatically increasing a possibility that the component damaging the organic EL layer penetrates from defects such as pinholes, which are sparsely present in the protective layer, to give rise to dark areas in a wide region of the display area.

On the other hand, Japanese Patent Laid-Open No. 2008-78038 or the like proposes an organic EL element substrate in which a separation wall is used to separate an organic EL layer and the like into plural parts (see PTL2 or the like). A structure in Japanese Patent Laid-Open No. 2008-78038 is intended to use a vapor deposition method having high directionality to separate the organic EL layer with use of the separation wall. At the same time, the structure is intended to expose an auxiliary electrode formed on the substrate and to form a transparent electrode by a sputtering method exhibiting relatively good coverage (i.e., having low directionality) to connect the transparent electrode to the auxiliary electrode. Besides this proposal, it is well known that, an orthogonal grid shaped separation wall is formed on the organic EL element substrate side in the case of using inkjet or the like to form the organic EL layer itself. Alternatively, for example, if a metal transparent electrode that is thin enough to transmit light is formed by a vapor deposition method having high directionality as done in the organic EL layer, and the transparent electrode is separated into a plurality of lines by the separation wall, it become possible not to control the display area as a whole, but to control it for each of the lines. Accordingly, in view of versatility of control, forming the separation wall on the organic EL element substrate side itself could be easily thought. However, in such an organic EL display in which the organic EL element substrate is bonded to the color filter substrate having the color conversion layer, it is easily inferred that a height of the separation wall on the color filter side and a height of the separation wall on the organic EL element substrate side are simply summed, which further increases an optical loss.

PTL 1: Japanese Patent Laid-Open No. 2006-32010
PTL 2: Japanese Patent Laid-Open No. 2008-78038
PTL 3: Japanese Patent Laid-Open No. 2005-93398

SUMMARY OF THE INVENTION

Therefore, an object of the present invention is to provide an organic EL display that has a reduced optical loss and high efficiency and is inexpensive, in the field of a top emission type organic EL display based on a color conversion system. Also, another object of the present invention is to provide a large screen organic EL display that has increased bonding strength in a display area, and exhibits high resistance to heat shock and impact. Further, still another object of the present invention is to provide an organic EL display that enables selectivity of filler included in a bonding gap to be expand and can be manufactured by a simple method. An organic EL display of the present invention is formed by bonding together: an organic EL element substrate comprising a substrate, a reflective electrode, an organic EL layer, a separation wall, a barrier layer, a transparent electrode, and a color conversion layer; and a sealing substrate, wherein: the reflective electrode is constituted of a plurality of partial electrodes; the organic EL layer is formed on the reflective electrode and is constituted of a plurality of parts that are separated by the separation wall; the transparent electrode is formed on the organic EL layer; the barrier layer covers the separation wall and the transparent electrode, and has recessed parts in a location corresponding to the reflective electrode; and the color conversion layer is formed in the recessed parts. Here, a refractive index of the color conversion layer is desirably equal to or more than a refractive index of the barrier layer. Also, the sealing substrate may further comprise a color filter.

In the organic EL display of the present invention, the separation wall may have a plurality of openings respectively corresponding to the partial electrodes that constitute the reflective electrode; and the organic EL layer may be formed in the plurality of openings. Here, the organic EL display may further comprise auxiliary wiring for the transparent electrode, wherein the auxiliary wiring may be connected to the transparent electrode in an area where the organic EL layer is not formed by the separation wall. Alternatively, the separation wall may be formed of a metallic material; and the transparent electrode may be electrically connected to the separation wall.

Further, in the organic EL display of the present invention, the separation wall may be constituted of a plurality of striped parts that are arranged in gaps between the plurality of partial electrodes constituting the reflective electrode and extend in one direction; and the organic EL layer may be formed in a gap of the separation wall. Here, the transparent electrode may be constituted of a plurality of striped parts that are separated by the separation wall. In the case where the transparent electrode is constituted of the plurality of striped parts, for each of the plurality of striped parts of the transparent electrode, applied voltage can be individually controlled or an electrical characteristic can be measured.

The organic EL display of the present invention can achieve significant improvement of color conversion efficiency. This working effect arises from the facts that (a) in the present invention, formation of the color conversion layer on the barrier layer of the organic EL element substrate to discreate a distance between the barrier layer and the color conversion layer corresponds to making all of light exited from the barrier layer reach a surface of the color conversion layer of an intended sub pixel in the conventional structure, and that (b) the absence of a low refractive index layer between the barrier layer and the color conversion layer, i.e., in a path from the light emitting layer to the color conversion layer reduces reflection losses at interfaces between the respective layers.

Also, in the organic EL display of the present invention, growth of a defect referred to as a dark area or dark spot is hardly recognized. It is thought that this effect arises from the fact that the separation wall is formed before the formation of the organic EL layer in the present invention, which is distinct from the conventional organic EL element substrate in which the separation wall is formed after the formation of the organic EL layer. This is because formation of the separation wall before forming the organic EL layer make it possible to sufficiently carry out a heating process as countermeasures against outgas from the separation wall. Further, another factor of this effect is that the organic EL layer is divided into the plurality of parts in the organic EL display of the present invention. Thereby, the defect referred to as the dark area or dark spot does not propagate throughout the display area, even if outgas (such as moisture) penetrates into the organic EL layer on the basis of the transmission from the separation wall.

Further, in the organic EL display of the present invention, no bonding gap is present in a light path from the organic EL layer to the color conversion layer, and therefore a conventional material such as a typical adhesive can be used as a material to be filled at the time of bonding. To increase the number of options for the filling material enables a manufacturing method to be simplified and/or manufacturing cost to be reduced due to a reduction in material cost. Also, in the organic EL display of the present invention, without newly forming the separation wall, it is possible to form a structure (such as the auxiliary wiring or transparent electrode separated wiring), in which a separation wall on the organic EL element substrate side is necessary to manufacture. Even if such a structure is formed, the color conversion layer can be formed by an application method. This is also advantageous to reduction of the manufacturing cost of the organic EL display.

In addition, in the organic EL display of the present invention, the bonded parts, in which the organic EL element substrate is adhered with the sealing substrate without interposition of the organic EL layer, are present throughout a whole of the display area, and therefore mechanical strength of the bonding is increased to improve mechanical reliability. Besides, acquisition of the mechanical strength in the display area leads to a possibility of production of a display having an extremely narrow circumferential frame in future, by eliminating necessity of an outer circumferential seal part.

DETAILED DESCRIPTION OF THE INVENTION

Figure 1:
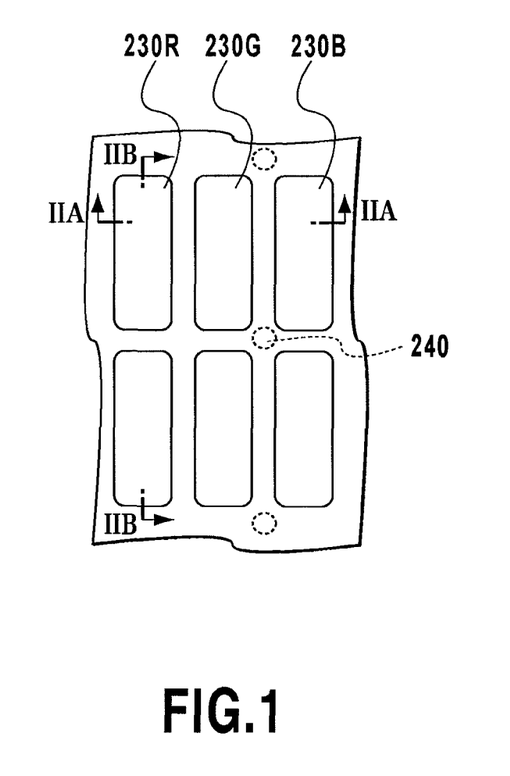
FIG. 1 is a top view illustrating an organic EL display of the present invention.

FIG. 1 is a top view of a sealing substrate 210 side of an organic EL display of the present invention. FIG. 1 illustrates an embodiment in which a black matrix 220 and three types of color filters 230 are formed on the sealing substrate 210. The organic EL display illustrated in FIG. 1 has three types of sub pixels indicated by red color filters 230R, green color filters 230G, and blue color filters 230B, in which spacers 240 are arranged so as to be adjacent to two green sub pixels and two blue sub pixels.

Figure 2A:
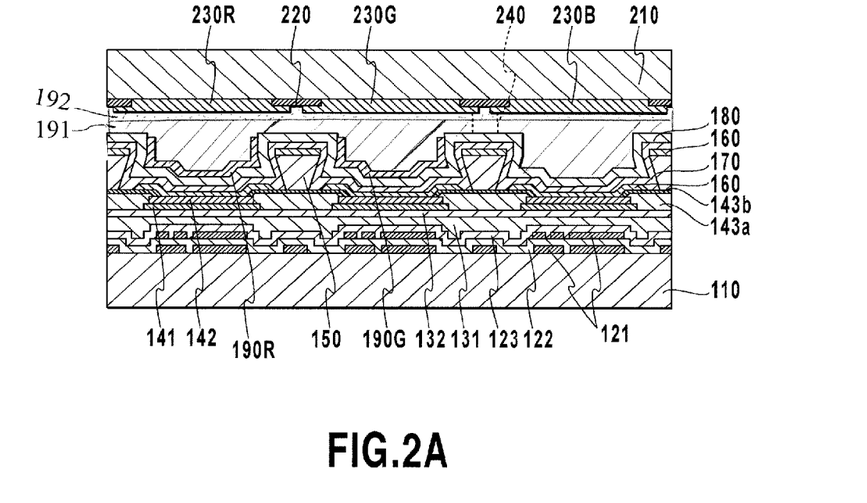
FIG. 2A is a view illustrating a cross section of the organic EL display according to a first embodiment of the present invention, which is cut along a section line IIA-IIA.
Figure 2B:
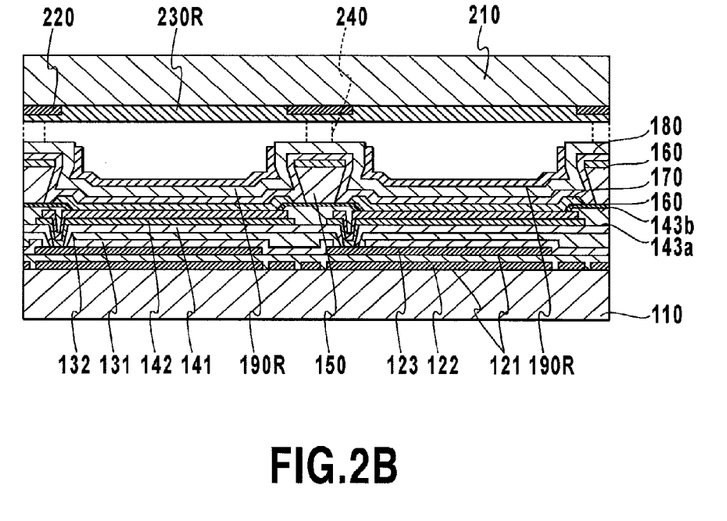
FIG. 2B is a view illustrating a cross section of the organic EL display according to the first embodiment of the present invention, which is cut along a section line IIB-IIB.

Cross-sectional views of the organic EL display according to a first embodiment of the present invention are illustrated in FIGS. 2A and 2B. FIG. 2A is the cross-sectional view along a section line IIA-IIA illustrated in FIG. 1, and FIG. 2B is the cross-sectional view along a section line IIB-IIB illustrated in FIG. 1.

On a TFT substrate 110, a patterned electrically conductive layer 121 and an insulating layer 122 are formed to form drive circuit wiring. As illustrated in FIG. 2B, the drive circuit wiring is covered by a protective layer 123 except for contact holes for connecting the electrically conductive layer 121 with a reflective electrode 142. Then, a planarizing layer 131 is formed so as to cover the protective layer 123, and an upper surface of the planarizing layer 131 is planarized. At this time, the contact holes for connecting the electrically conductive layer 121 with the reflective electrode 142 are also formed in the planarizing layer 131 as illustrated in FIG. 2B. The planarizing layer 131 is formed from any resin material known in the art, and the contact holes can be formed by patterning based on a photolithography method. Subsequently, an inorganic passivation layer 132 for blocking outgas from the planarizing layer 131 is formed. As illustrated in FIG. 2B, the contact holes for connecting the electrically conductive layer 121 with the reflective electrode 142 are also formed in the inorganic passivation layer 132. The inorganic passivation layer 132 is desirably formed so as to completely cover a side surface of the planarizing layer 131 in each of the contact holes. As described above, the electrically conductive layer 121 is electrically connected to the reflective electrode 142 through the contact holes that are formed in the protective layer 123, planarizing layer 131, and inorganic passivation layer 132 with being registered.

Then, an underlying layer 141 for the reflective electrode is formed from electrically conductive oxide such as IZO or ITO. The underlying layer 141 is a layer provided as needed. However, in order to ensure adhesiveness between the reflective electrode 142 and the inorganic passivation layer 132, it is desirable to provide the underlying layer 141. In the case where the underlying layer 141 is present, the underlying layer 141 is connected to the electrically conductive layer 121 (parts of TFT elements) on bottom surfaces of the contact holes provided through the protective layer 123, planarizing layer 131, and inorganic passivation layer 132. Subsequently, the reflective electrode 142 is formed on the underlying layer 141. The reflective electrode 142 may be a single layer film made of a high reflectance metallic material such as MoCr, CrB, Ag, Ag alloy, or Al alloy, or a stacked film of the high reflectance metallic material and a transparent conductive oxide material such as IZO or ITO. The transparent conductive oxide material is effective in protection of the high reflectance metallic material and in adjustment of an optical distance in the resultant organic EL display. In the case where the underlying layer 141 is absent, the reflective electrode 142 is directly connected to the electrically conductive layer 121 (parts of the TFT elements) on the bottom surfaces of the contact holes.

In the present invention, the underlying layer 141 is divided into a plurality of parts, and each of the parts is formed in a location corresponding to a light emitting part (sub pixel in the configuration illustrated in FIGS. 1 to 2B). Accordingly, the reflective electrode 142 is also constituted of a plurality of partial electrodes that are formed in locations corresponding to light emitting parts.

Subsequently, an insulating film 143a is formed so as to cover shoulder parts of the partial electrodes which constitute the reflective electrode 142. The insulating film 143a is formed of an inorganic material, or an organic material (such as polyimide) that can be sufficiently degassed or dehydrated. FIGS. 2A and 2B illustrate a configuration in which the insulating film 143a is covered by an insulating film barrier layer 143b that may be provided optionally. The insulating film barrier layer 143b is desirably formed from an inorganic material. The insulating film barrier layer 143b is effective in preventing outgas such as moisture from penetrating from the insulating film 143a into an organic EL layer 160 or the like, especially in the case where the insulating film 143a is formed from the organic material.

Subsequently, a separation wall 150 is formed on the insulating film 143a and insulating film barrier layer 143b. In the present embodiment, the separation wall 150 is constituted of: a plurality of striped parts extending in a longitudinal direction (direction of the section line IIB-IIB); and a plurality of striped parts extending in a transverse direction (direction of the section line IIA-IIA) orthogonal to the first direction, and the separation wall 150 has a plurality of openings. In the respective openings of the separation wall 150, the partial electrodes constituting the reflective electrode 142 are exposed. The separation wall 150 desirably has a height of 3 to 7 μm from a surface of the reflective electrode 142, since the separation wall 150 will be also used as a bank at the time of forming a color conversion layer 190 later.

The separation wall 150 may be formed from any of organic and inorganic materials. Here, it is desirable to use an organic material, from the perspective of easily increasing a film thickness and being able to suppress manufacturing cost. In the case of using an organic material, it is necessary to sufficiently remove moisture contained in the material through a baking operation or the like, to suppress outgas from being generated as much as possible. Also, in the case of using an organic material, the separation wall 150 desirably has a reverse tapered cross section, in order to divide the organic EL layer 160 formed by a vapor deposition method into a plurality of parts.

Inorganic materials that can be used to form the separation wall 150 include metal. In the case of using metal to form the separation wall 150, the separation wall 150 can be formed by a plating method or the like, in order to ensure the height from the surface of the reflective electrode 142. As described in Japanese Patent Laid-Open No. 2005-93398, the separation wall 150 may have a cross-sectional shape such as a reverse tapered shape or rectangular shape, in the case of using metal to form the separation wall 150 (see Patent literature 3). Metallic materials that can be used to form the separation wall 150 include Cu, Al, Ag, Au, Ni, Mo, and Ti. In particular, in the case where the organic EL display has the light emitting parts having a relatively small size, the separation wall 150 made of metal functions as auxiliary wiring of a transparent electrode 170 which will be formed later. The separation wall 150 made of metal is effective in suppressing the occurrence of luminance unevenness and the increase in power consumption, on the basis of a reduction in wiring resistance of the transparent electrode 170.

Subsequently, the organic EL layer 160 is deposited on a stacked body in which the separation wall 150 has been formed. The organic EL layer 160 at least comprises an organic light emitting layer, and may further comprise one or more layers for facilitating injection and/or transport of electrons and/or holes. For each of layers constituting the organic EL layer 160, any material known in conventional technique can be used.

In the case where the separation wall 150 has a reverse tapered cross-sectional shape, the organic EL layer 160 is formed on an upper surface of the reflective electrode 142 (including an upper surface of the insulating film barrier layer 143b around the reflective electrode 142) and an upper surface of the separation wall 150. The organic EL layer 160 formed on the upper surface of the reflective electrode 142 is divided into the plurality of parts by the separation wall 150. In the present embodiment, the plurality of parts of the organic EL layer 160 are formed with corresponding one-to-one to the plurality of partial electrodes constituting the reflective electrode 142. In other words, the organic EL layer 160 is formed with being separated for each of the plurality of light emitting parts (sub pixels). Also, each of the plurality of parts of the organic EL layer 160 formed on the upper surface of the reflective electrode 142 is not in contact with any of side surfaces (walls) of the separation wall 150. By the facts that the organic EL layer 160 formed on the upper surface of the reflective electrode 142, which is involved in light emission, is not in contact with the separation wall 150 and that the transparent electrode 170 intervenes (described later) between the organic EL layer 160 and the separation wall 150, moisture from the separation wall 150 can be blocked from penetrating. Also, even if moisture penetrates from the separation wall 150, or if moisture penetrates from outside through a defect present in a barrier layer 180 (described later), the organic EL layer 160 deteriorates only in a part where moisture penetrates, and the deterioration (i.e., area referred to as a dark spot or dark area) does not propagate throughout the organic EL layer 160, since the organic EL layer 160 is separated into the plurality of parts.

Further, even if a defect is present in the insulating film barrier layer 143b, and outgas penetrates through the insulating film 143a, the deterioration does not propagate throughout the organic EL layer 160 as well.

Subsequently, the transparent electrode 170 is formed on the organic EL layer 160. The transparent electrode 170 in the present invention may be transparent or semitransparent. The transparent electrode 170 can be formed by depositing transparent conductive oxide such as ITO or IZO by a sputtering method. The transparent electrode 170 is formed so as to cover an upper surface of the organic EL layer 160 and the upper and side surfaces of the separation wall 150. At this time, in order to reduce sputtering-based damage to the organic EL layer 160, a highly transparent metal thin film such as MgAg or Au (not illustrated) may be formed before the deposition of the transparent conductive oxide. If present, the metal thin film desirably has a film thickness of a few nm.

In a circumferential edge part of the display area, the transparent electrode 170 is connected to a power supply line, GND wiring, and the like in a contact hole different from the contact holes for the light emitting parts illustrated in FIG. 2B.

Then, the barrier layer 180 is formed so as to cover a structure including and below the transparent electrode 170. The barrier layer 180 is a layer for preventing moisture and gas from outside from penetrating into the organic EL layer 160. Meanwhile, the barrier layer 180 desirably has high transmittance, because it is present on a path through which emitted light of the organic EL layer 160 is transmitted. Also, the barrier layer 180 desirably has a high refractive index equivalent to that of the transparent electrode 170, from the perspective of preventing reflection at an interface between the barrier layer 180 and the transparent electrode 170 or color conversion layer 190 in order to improve transmission efficiency of the emitted light of the organic EL layer 160. A single layer film of SiN or SiON or a multi-layered film of SiN and SiON can be used as the barrier layer 180. A sputtering method, Chemical Vapor Deposition (CVD) method, or the like can be used to form the barrier layer 180. In order to pursue better coverage, the barrier layer 180 is desirably formed by the CVD method. Thereby, the barrier layer 180 that has recessed parts in gaps between the parts of the separation wall 150 (i.e. positions corresponding to the partial electrodes of the reflective electrode 142) is formed.

Then, the color conversion layer 190 constituted of a plurality of parts is formed in the recessed parts of the barrier layer 180 which are formed on the basis of the height of the separation wall 150. In other words, the separation wall 150 is used as the bank to form the color conversion layer 190 constituted of the plurality of parts. FIG. 2A illustrates an embodiment where two kinds of color conversion layers 190 consisting of red color conversion layers 190R and green color conversion layers 190G are formed The color conversion layer 190 can be formed by an application method in a broad sense, such as an inkjet method, dispenser method, or printing method. The color conversion layer 190 desirably has a refractive index equal to or more than that of the barrier layer 180. If the color conversion layer 190 has such a refractive index, reflection at an interface between the barrier layer 180 and the color conversion layer 190 can be prevented to improve incident efficiency of the emitted light of the organic EL layer 160 into the color conversion layer 190.

In order to prevent the color conversion layer 190 from being deteriorated and also a color converting material from being eluted into filler when the filler is enclosed in a bonding gap, a protective layer 191 may be further provided on the color conversion layer 190. The protective layer can be formed from an inorganic material or resin.

The organic EL display of the present embodiment is obtained by bonding the sealing substrate 210 to the organic EL element substrate formed as described above. The sealing substrate 210 may be a plate-like member made of a transparent material, or a substrate in which the color filters 230 and/or black matrix 220 are formed on the plate-like member. FIGS. 2A and 2B illustrate the embodiment where the black matrix 220 and the color filters 230 including the red color filter 230R, green color filter 230C, and blue color filter 230B are provided on the sealing substrate 210. The sealing substrate 210 can be foamed from a transparent material such as glass. The black matrix 220 and color filters 230 can be formed from commercially available materials for flat panel display.

In the case of forming the black matrix 220, the black matrix 220 is formed so as to have openings in locations corresponding to the light emitting parts (locations corresponding to the sub pixels, the partial electrodes of the reflective electrodes 142, or the like) of the organic EL element substrate. In the case of forming the color filters 230, the color filters 230 are formed in locations corresponding to desired light emitting parts (sub pixels) of the organic EL element substrate. In the case of forming both of the black matrix 220 and the color filters 230, it is desirable to form the black matrix 220 first and then form the color filters 230. In this case, circumferential parts of the color filters 230 may overlap the black matrix 220.

When the organic EL element substrate and the sealing substrate 210 are bonded together, the spacers 240 may be formed on any of the substrates. In the case of forming the spacers 240 on the organic EL element substrate, it is convenient to form the spacers 240 on the barrier layer 180 that has been formed on the separation wall 150. In this case, it is not necessary to provide the spacers 240 on the whole of the separation wall 150. For example, as illustrated in FIGS. 1 to 2B, the spacers 240 can be provided only at the positions adjacent to the two green light emitting parts (sub pixels) and two blue light emitting parts (sub pixels), where the striped parts of the separation wall 150 intersect with each other. On the other hand, in the case of providing the spacers 240 on the sealing substrate 210, the spacers 240 is preferably provided in locations where the emitted light of the organic EL layer 160 does not pass through. Also, in the case of using the sealing substrate 210 provided with the black matrix 220 and/or color filters 230, the spacers 240 maybe provided on the black matrix 220 or on overlapped parts of the black matrix 220 and the color filters 230.

Following the formation of the spacers 240, the organic EL element substrate and the sealing substrate 210 are bonded together. As illustrated in FIGS. 2A and 2B, in the case where the color filters 230 and black matrix 220 are provided on the sealing substrate 210, the bonding is performed such that the locations of the light emitting parts of the organic EL element substrate and the locations of the openings of the black matrix 220 on the sealing substrate 210 are accurately in registration. The bonding can be performed by means of a UV curable adhesive that is provided in a circumferential edge part of the organic EL element substrate or sealing substrate 210 so as to surround the display area of the organic EL element substrate. At the time of the bonding, gas (atmospheric gas at the time of the bonding) may be filled in the boding gap that is formed between the organic EL element substrate and the sealing substrate 210. However, liquid or solid material 192 having a refractive index of 1.3 or more is preferably filled into the bonding gap, in order to prevent the occurrence of an interference pattern and the reduction of light transmission efficiency due to reflection at interfaces adjacent to the bonding gap. Further, in order to increase mechanical strength of the resultant organic EL display, it is more desirable to fill a liquid adhesive or the like in the bonding gap at the time of the bonding, and then after the bonding, cure and solidify it. Methods for filling a liquid material at the time of the bonding include, for example, a vacuum dripping bonding method.

In the organic EL element substrate of the present embodiment, the organic EL layer 160 having low mechanical strength is not foamed in areas where the separation wall 150 is formed. Accordingly, in the case where the liquid adhesive is filled in the bonding gap to perform the bonding, the areas where the separation wall 150 is formed contribute to improvement of strength of the adhesion to the sealing substrate 210. Therefore, in the organic EL display of the present invention, mechanical strength of the bonding in the display area can be ensured to narrow a circumferential edge of the display area, which is so-called as a "frame". The necessity of the UV curable adhesive (so-called an "outer circumferential seal part") provided in the substrate circumferential edge part may be eliminated by the above technique, in future.

Figure 3A:
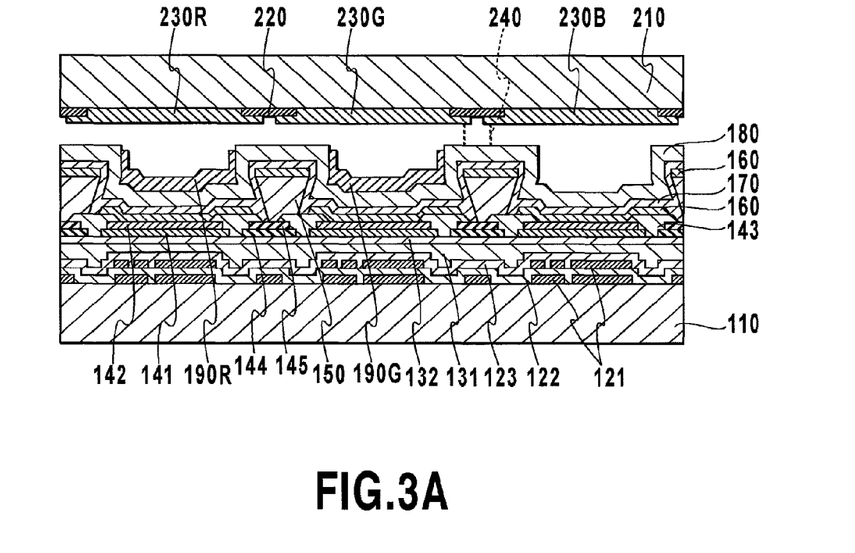
FIG. 3A is a cross-sectional view illustrating an organic EL display according to a second embodiment of the present invention.
Figure 3B:
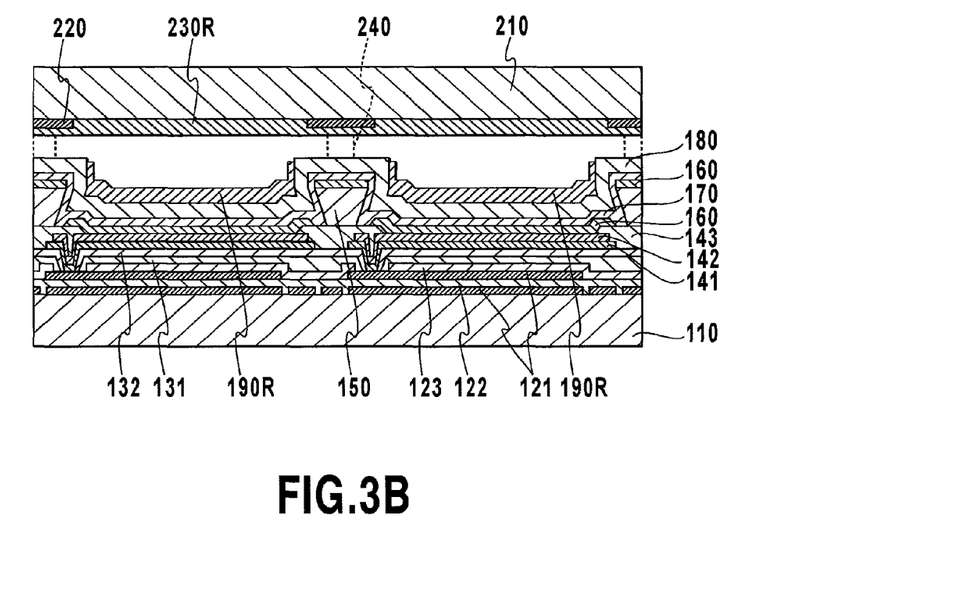
FIG. 3B is cross-sectional view illustrating the organic EL display according to the second embodiment of the present invention.

Cross sections of a second embodiment of the organic EL display of the present invention are illustrated in FIGS. 3A and 3B. The cross sections illustrated in FIGS. 3A and 3B correspond to those illustrated in FIGS. 2A and 2B, respectively. The present embodiment has auxiliary wiring 145 that is advantageous to enlarging a size of the organic EL display. The auxiliary wiring 145 is effective in, suppressing occurrence of luminance unevenness and increase of power consumption, which are caused by wiring resistance of the transparent electrode 170. A configuration including and below an inorganic passivation layer 132 of the organic EL display in the present embodiment is the same as that in the first embodiment, and therefore can be formed by the same method as that described above.

Subsequently, an underlying layer 144 for the auxiliary wiring and the auxiliary wiring 145 are formed simultaneously with the formation of an underlying layer 141 for a reflective electrode (if it exists) and the reflective electrode 142. That is, the auxiliary wiring 145 is made of a low resistance metallic material, and therefore has lower resistance than that of the transparent electrode 170 made of transparent conductive oxide. Each of the underlying layer 144 and the auxiliary wiring 145 is constituted of a plurality of parts. Also, each of the plurality of parts is formed in a gap between the underlying layer 141 and the reflective electrode 142 that constitute a light emitting part. The auxiliary wiring 145 is connected to a power supply line, GND wiring, and the like in a contact hole different from those for the light emitting parts illustrated in FIG. 3B.

Then, an insulating film 143 is formed so as to cover shoulder parts of partial electrodes that constitute the reflective electrode 142. In the present embodiment, openings for connecting the auxiliary wiring 145 with the transparent electrode 170 are formed in the insulating film 143. The insulating film 143 can be formed with use of the same material and process as those used for the insulating film 143a in the first embodiment, except that patterning is performed to form the openings. Also in the present embodiment, an insulating film barrier layer may be formed under the condition that it does not block the openings of the insulating film 143.

Subsequently, a separation wall 150 is formed on the insulating film 143. The separation wall 150 of the present embodiment has a reverse tapered cross-sectional shape, and are arranged such that the openings of the insulating film on the auxiliary wiring 145 are positioned below an upper surface of the separation wall 150. Such cross-sectional shape and arrangement enable an after-mentioned organic EL layer 160 to be formed so as not to block the openings of the insulating film 143.

Then, the organic EL layer 160 and transparent electrode 170 are formed with use of the same methods and materials as those in the first embodiment. As in the first embodiment, the organic EL layer 160 is formed with being separated by the separation wall 150 for each of the plurality of light emitting parts. The transparent electrode 170 is formed by a sputtering method that exhibits superior coverage, and therefore formed on the upper and side surfaces of the separation wall and an upper surface of the organic EL layer 160, and also the transparent electrode 170 is electrically connected to the auxiliary wiring 145 below the upper surface of the separation wall, where the organic EL layer 160 is not formed. By connecting the transparent electrode 170 to the low resistive auxiliary wiring 145, wiring resistance of the transparent electrode 170 can be reduced to suppress occurrence of luminance unevenness and increase of power consumption.

The separation wall 150 desirably has a height of about 1.5 to 3 μm, from the perspectives of the separation of the organic EL layer 160 and the connection of the auxiliary wiring 145 with the transparent electrode 170. However, as in the first embodiment, the separation wall 150 desirably has a height of 3 to 7 μm in order to also use the separation wall 150 as a bank for separating a color conversion layer 190.

A barrier layer 180 and the color conversion layer 190 can be formed with use of the same materials and methods as those in the first embodiment. Also, a sealing substrate 210 may have the same material and configuration (color filters 230, black matrix 220, and the like) as those in the first embodiment. Bonding to the sealing substrate 210 can also be performed by the same method as that in the first embodiment.

The organic EL display of the present embodiment is suitable for the case where the light emitting parts have a relatively large size, since an area of each of the light emitting parts is reduced by the presence of the auxiliary wiring 145. In the case where a size of each of the light emitting parts is relatively small, it is effective to form the separation wall 150 made of metal in the first embodiment, and use the separation wall 150 as the auxiliary wiring.

Figure 4A:
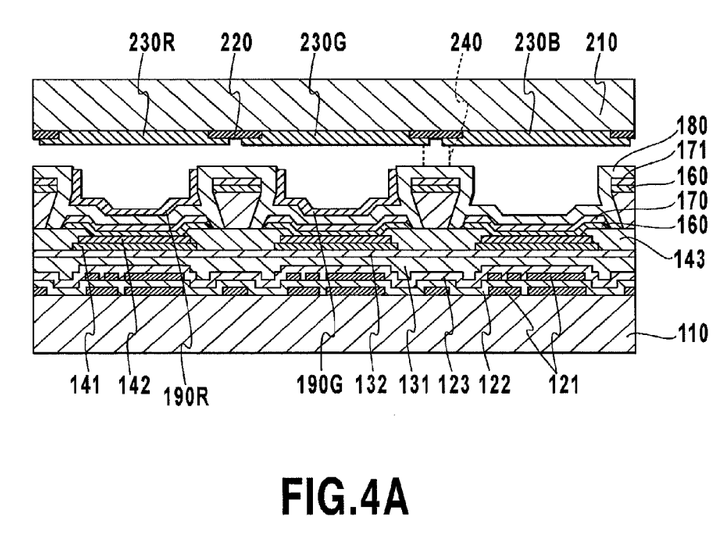
FIG. 4A is a cross-sectional view illustrating an organic EL display according to a third embodiment of the present invention.
Figure 4B:
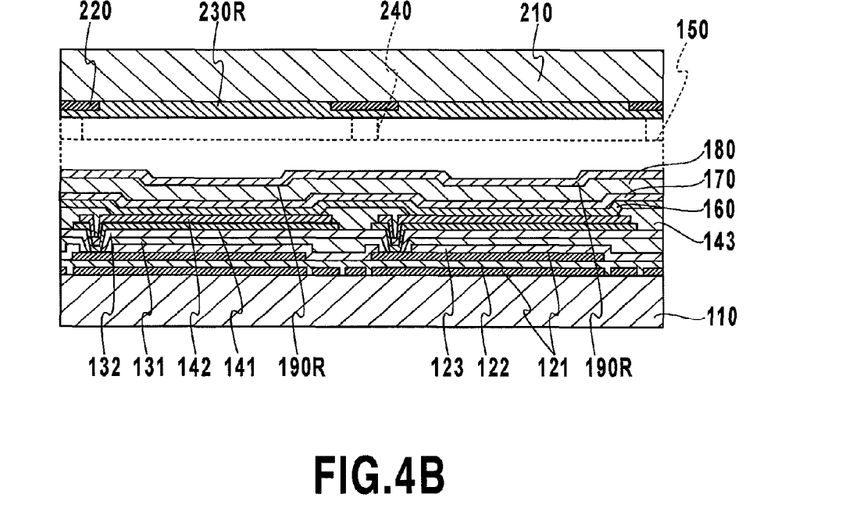
FIG. 4B is cross-sectional view illustrating the organic EL display according to the third embodiment of the present invention.

Cross sections of a third embodiment of the organic EL display of the present invention are illustrated in FIGS. 4A and 4B. The cross sections illustrated in FIGS. 4A and 4B correspond to the cross sections illustrated in FIGS. 2A and 2B, respectively. The present embodiment has: an organic EL layer 160 constituted of a plurality of parts that are separated for each of light emitting part lines (sub pixel lines); and a transparent electrode 170 constituted of a plurality of partial electrodes that are separated for each of the light emitting part lines (sub pixel lines). The transparent electrode 170 constituted of the plurality of partial electrodes enables various types of control, such as current measurement for each of the light emitting part lines, and voltage control for each of the light emitting part lines. A configuration including and below an insulating film 143 of the organic EL display in the present embodiment is the same as that in the second embodiment, and therefore can be formed by the same methods as those described above. It is noted that FIGS. 4A and 4B illustrate a configuration in which an insulating film barrier layer is not provided; however, even in the present embodiment, the insulating film barrier layer can be formed.

A separation wall 150 in the present embodiment is constituted of a plurality of striped parts that extend in one direction. The striped parts of the separation wall 150 are respectively arranged in gaps between a plurality of partial electrodes that constitute a reflective electrode 142. FIGS. 4A and 4B illustrate an embodiment of the separation wall 150 that extends in a longitudinal direction (direction of the section lines IIB-IIB in FIG. 1). Except for the above-described point, the separation wall 150 can be formed with use of the same material and method as those in the first embodiment.

Then, the organic EL layer 160 is formed with use of the same materials and methods as those in the first embodiment. The organic EL layer 160 is formed on an upper surface of the reflective electrode 142 and an upper surface of the separation wall 150, as done in the first embodiment. However, in the present embodiment, the resultant organic EL layer 160 is constituted of a plurality of striped parts that are continuous in each of the light emitting part lines as illustrated in FIG. 4B, differently from that of the first embodiment illustrated in FIG. 2B.

Subsequently, the transparent electrode 170 is formed from a semitransparent metallic material such as MgAg or Au. The transparent electrode 170 in the present embodiment has a film thickness of about 10 to 50 nm. To form the transparent electrode 170, a vapor deposition method is used. A metallic material film is formed on an upper surface of the organic EL layer 160 which is on the reflective electrode 142 and separation wall 150. In the present embodiment, the part formed on the upper surface of the organic EL layer 160 functions as the transparent electrode 170, and the metallic film 171 formed on the separation wall 150 is separated from the transparent electrode 170 and does not function as an electrode. Accordingly, as illustrated in FIG. 4B, the transparent electrode 170 is constituted of the plurality of striped partial electrodes that extend in the same direction as that of the separation wall 150. Each of the plurality of partial electrodes constituting the transparent electrode 170 is connected to a power supply line, GND wiring, and the like in a contact hole different from contact holes for light emitting parts, in a circumferential edge part of a display area.

The separation wall 150 desirably has a height of about 1.5 to 3 μm, from the perspective of separating the organic EL layer 160 and transparent electrode 170 into the pluralities of striped parts. However, as in the first embodiment, the separation wall 150 desirably has a height of 3 to 7 μm, in order to also use the separation wall 150 as a bank for separating a color conversion layer 190.

A barrier layer 180 and the color conversion layer 190 can be formed with use of the same methods and materials as those in the first embodiment. Also, a sealing substrate 210 may have the same materials and configuration (color filters 230, black matrix 220, and the like) as those in the first embodiment. Bonding to the sealing substrate 210 can also be performed by the same method as that in the first embodiment.

In the present embodiment, the transparent electrode 170 is separated into the plurality of partial electrodes respectively for the light emitting part lines, and therefore current can be measured for each of the light emitting part lines. Also, the organic EL display can be controlled variously, such as voltage control for each of the light emitting part lines.

EXAMPLES

Example 1

The present example is an example of the organic EL display of the first embodiment of the present invention. An organic EL display in the present example has a nominal size of 3 inches, and each pixel has a size of 60 μm×180 μm×RGB. Also, a color filter substrate was used, in which the black matrix 220 and three types of color filters 230 were formed on the sealing substrate 210.

On alkali-free glass having a size of 200 mm×200 mm×0.7 mm (manufactured by Asahi glass, AN-100), the electrically conductive layer 121 (including switching elements and wiring), insulating layer 122, and protective layer 123 for a plurality of display parts were formed. Then, the planarizing layer 131 was formed on the protective layer 123. The planarizing layer 131 was patterned to form a contact hole for connecting the electrically conductive layer 121 with the reflective electrode 142 in each of the sub pixels (light emitting parts) by a photolithography method, wherein the contact hole had a size of 20 μm square.

Subsequently, an $SiO_2$ film having a film thickness of 300 nm was formed on a whole surface by a sputtering method. Then, an opening that is smaller than the bottom surface was formed on a bottom surface of each of the contact holes by a dry etching method, to obtain the inorganic passivation layer 132. By the above operations, the planarizing layer 131 was completely covered by the inorganic passivation layer 132, and at the same time, the electrically conductive layer 121 was brought into a state of being exposed on the bottom surface of each of the contact holes.

Subsequently, an IZO film having a film thickness of 50 nm was formed by an RF-planar magnetron sputtering method in Ar atmosphere. Then, a resist material "OFPR-800" (manufactured by Tokyo ohka) was applied followed by exposure and development to form a pattern. The IZO film was wet etched with using the pattern as a mask, to form the underlying layer 141 constituted of the plurality of parts separated for the respective sub pixels. Each of the parts constituting the underlying layer 141 was connected to the electrically conductive layer 121 through the contact hole formed in the planarizing layer 131 and inorganic passivation layer 132. Then, an Ag alloy film having a film thickness of 200 nm was formed by a sputtering method, so as to cover the underlying layer 141, and, then, a similar patterning process was carried out to form the reflective electrode 142 constituted of the plurality of parts. Each of the plurality of parts constituting the reflective electrode 142 was arranged so as not to protrude from the underlying layer 141.

Then, a novolac-based photosensitive resin film having a film thickness of 1 μm was applied by a spin coat method. Subsequently, patterning of the resin film was performed by a photolithography method, so as to provide the openings on the reflective electrode 142, the openings being both longitudinally and transversely about 2 to 4 μm larger than the size (about 36 μm×about 150 μm) of the light emitting parts. Thereby, the insulating film 143a was formed. The resultant insulating film 143a was baked at about 230° C. to sufficiently discharge off outgas such as moisture. Then, an SiN film having a film thickness of 300 nm was formed by a CVD method. The resultant SiN film was patterned by a dry etching method, to form the openings having the above-described size of the light emitting part. Then, the insulating film barrier layer 143b was formed, thereby the insulating film 143a was completely covered by the insulating film barrier layer 143b. Besides, the insulating film barrier layer 143b had openings for providing required electrical connection parts, in circumferential edge parts of display areas of the plurality of display parts arrayed on the substrate, in addition to the above-described openings.

Then, photosensitive resin (manufactured by Hitachi chemical, CR-600) was applied and patterned by a photolithography method to form the separation wall 150 that was constituted of the plurality of striped parts extending longitudinally and the plurality of striped parts extending transversely, and had the openings in the locations corresponding to the respective light emitting parts. Each of the striped parts of the separation wall 150 had the reverse tapered (reverse trapezoidal shaped) cross section having an upper bottom of about 10 μm, lower bottom of about 6 μm, and height of about 5 μm from the electrode surface. The resultant separation wall 150 was baked at about 220° C. to discharge off outgas such as moisture. By this operation, the separation wall 150 having a transverse opening width of about 50 μm with respect to a transverse sub pixel pitch of 60 μm was obtained. It is noted that the "transverse" direction in the present example refers to a right-left direction in FIG. 2A.

Subsequently, a stacked body wherein the separation wall 150 had been formed was loaded into a resistive heating vapor deposition device. By a vapor deposition method using a mask having openings corresponding to the display areas of the plurality of display parts arrayed on the substrate, the following layers were formed on the reflective electrode 142 and on the upper surface of the separation wall 150 in the following order, to obtain the organic EL layer 160: a buffer layer made of Li and having a film thickness of a 1.5 nm; an electron transport layer made of tris(8-hydroxyquinolinato) aluminum ($Alq_3$) and having a film thickness of 20 nm; a light emitting layer made of 4,4'-bis(2,2'-diphenylvinyl(biphenyl)) (DPVBi) and having a film thickness of 30 nm; a hole transport layer made of 4,4'-bis[N-(1-naphthyl)-N-phenylamino]biphenyl (α-NPD) and having a film thickness of 10 nm; and a hole injection layer made of copper phthalocyanine (CuPc) and having a film thickness of 100 nm. Further, a damage buffer layer (not illustrated) made of MgAg and having a film thickness of 5 nm was formed on the organic EL layer 160. The organic EL layer 160 and damage buffer layer were separated for each of the light emitting parts by the separation wall 150, and not in contact with any of side surfaces (walls) of the separation wall 150.

Then, without breaking vacuum, the stacked body in which the damage buffer layer had been formed was moved into a facing type sputtering device. Through a mask having openings corresponding to the plurality of display parts arrayed on the substrate, IZO having a film thickness of 200 nm was deposited to obtain the transparent electrode 170. The IZO film was formed on the organic EL layer 160 including the upper surface of the separation wall 150 and also on the side surfaces of the separation wall 150 to provide the transparent electrode 170 that functioned as an integrated electrode in each of the display parts. Also, transparent electrode 170 was connected to the electrically conductive layer 121 through unillustrated contact holes in the circumferential edge parts of the display area of the respective display parts. By the above operations, the organic EL layer 160 in each of the light emitting parts was surrounded by the reflective electrode 142, and the underlying inorganic passivation layer 132, insulating film barrier layer 143b, and transparent electrode 170, all of which were formed of inorganic materials.

Then, without breaking vacuum, the stacked body in which the transparent electrode 170 had been formed was moved into a CVD device. An SiN film having a film thickness of 2 μm was deposited by a CVD method, to form the barrier layer 180. The resultant barrier layer 180 had a refractive index of about 1.8.

Subsequently, the stacked body in which the barrier layer 180 had been formed was placed in a multi-nozzle type inkjet device (droplet-landing accuracy of ±5 μm) that was located in an environment of an oxygen concentration of 50 ppm or less and a moisture concentration of 50 ppm or less. After registration by means of markers, color converting material ink was applied onto the barrier layer in banks resulted from the separation wall 150. The application of the ink was performed under the conditions that an ink droplet formed into a sphere having a diameter of about 30 μm during flight. Also, in each of the banks, three ink droplets were applied. After the ink droplets had been applied over a whole of the substrate, the substrate was heated to 100° C. to dry the ink. By repeating the above-described ink application and drying, the red color conversion layer 190R and green color conversion layer 190G respectively having film thicknesses of 0.5 μm were formed to obtain the organic EL element substrate. In this process, a so-called "color mixing" phenomenon, in which ink flowed into a bank adjacent to a predetermined bank, was not recognized.

In the present example, ink for Ruining the red color conversion layer 190R was a mixture of 1000 pbw (parts by weight) of toluene and 50 pbw of a pigment mixture of coumarin 6 and DCM (molar ratio between coumarin 6 and DCM was 48:2). Further, ink for forming the green color conversion layer 190G was a mixture of 1000 pbw of toluene and 50 pbw of a pigment mixture of coumarin 6 and DEQ (molar ratio between coumarin 6 and DEQ was 48:2).

On the other hand, onto the alkali-free glass (manufactured by Corning, Eagle 2000) sealing substrate 210 having a size of 200 mm×200 mm×0.7 mm, CK-7001 (available from Fujifilm corporation) was applied and patterned by a photolithography method to form the black matrix 220 having a film thickness of 1 μm in the display areas of the plurality of display parts. The black matrix 220 had a structure in which the plurality of openings having a size of 46 μm×160 μm were arrayed in the longitudinal and transverse directions. Here, a transverse line width (interval between the openings in the transverse direction) was set to 14 μm, and a longitudinal line width (interval between the openings in the longitudinal direction) was set to 20 μm.

Subsequently, CR-7001, CG-7001, and CB-7001 (all available from Fuji film corporation) were applied and patterned to form the red, green, and blue color filters 230R, 230G, and 230B, respectively, having film thicknesses of 1.5 μm. Each of the color filters 230 was constituted of the plurality of striped parts that extend longitudinally.

Then, photosensitive resin (manufactured by Hitachi chemical, CR-600) was applied onto the grid points of the black matrix 220, each of the grid points being adjacent to two openings of the black matrix 220 into which the green color filter 230G was provided, and two openings of the black matrix 220 into which the blue color filter 230B was provided. By the above operation, the cylindrically shaped spacers 240 having a diameter of 20 µm and a height of 2 µm were formed, to obtain the color filter substrate.

The organic EL element substrate and color filter substrate obtained in the above-described manner were moved into a bonding device that was installed in an environment of an oxygen concentration of 5 ppm or less and a moisture concentration of 5 µppm or less. The color filter substrate was placed with the surface, on which the spacers 240 had been formed, facing upward, and an epoxy-based UV curable adhesive (manufactured by Nagase chemtex, XNR-5516) is continuously applied by a dispenser onto outer circumferential parts of areas corresponding to the plurality of display parts. Then, a thermosetting epoxy adhesive having lower viscosity was dripped by a mechanical measuring valve (delivery accuracy of ±5% or less) onto central parts of the areas corresponding to the plurality of display parts.

Subsequently, the organic EL element substrate was arranged with the surface, on which the color conversion layer 190 had been formed, facing downward and opposing against the color filter substrate coated with the adhesives. The interior of the device was evacuated to a pressure of about 10 Pa or less, and then the both substrates were brought close to each other with the both substrates being kept parallel, until a distance between the substrates became about 30 µm. In a state where the UV curable adhesive was in contact with the organic EL element substrate, the both substrates were registered by an alignment mechanism. Then, a slight weight was applied to the both substrates while restoring pressure in the device to atmospheric pressure. At this time, the thermosetting epoxy adhesive was spread from the central parts of the areas corresponding to the plurality of display parts toward circumferential edge parts. Bringing the both substrates close to each other was stopped when the tops of the spacers came into contact with the separation wall 150 of the organic EL element substrate.

Subsequently, UV irradiation was carried out from the color filter substrate side through a mask, such that only the UV curable adhesive was irradiated with UV light and temporarily cured, and then the temporarily bonded body was removed from the bonding device. As a result of observing the temporarily bonded body, the thermosetting epoxy adhesive was spread over the whole areas corresponding to the respective display parts. Neither bubble generation in the areas nor protrusion beyond the UV curable adhesive in the outer circumferences of the areas was not recognized.

Subsequently, the temporarily bonded body was divided into the areas corresponding to the individual display parts, by means of an automatic glass scriber and a breaking device. The divided displays were heated at 80° C. for 1 hour in a heating furnace to cure the thermosetting epoxy adhesive, and then naturally cooled for 30 minutes. Finally, the barrier layer 180 on terminal parts for connecting to an external drive circuit and on IC connecting pads was removed by a dry etching method, to obtain a plurality of organic EL display.

The organic EL display obtained as described above in the present example exhibited improved efficiency by 30%, as compared with the organic EL display having the conventional structure in which the color conversion layer was provided on the color filters of the color filter substrate rather than the organic EL element substrate, and special resin having a refractive index of 1.7 was filled in the bonding gap. In the present example, manufacturing cost was able to be reduced, since the thermosetting epoxy adhesive used for filling the bonding gap was a general-purpose adhesive. Further, no remarkable expansion of a defect referred to as a dark area or dark spot was not recognized, when subjecting the organic EL display in the present example to a high-temperature shelf test. Also, no breakage occurred, when subjecting the organic EL display in the present example to a heat shock test.

Example 2

The present example is another example of the organic EL display of the, first embodiment of the present invention. An organic EL display in the present example has a nominal size of 3 inches, and each pixel has a size of 60 µm×180 µm×RGB. Also, a color filter substrate, in which the black matrix 220 and three types of color filters 230 were formed on the sealing substrate 210, was used.

First, in the same procedure as that in Example 1, the layers including and below the inorganic passivation layer 132 were formed.

Then, the separation wall 150 made of Cu was formed by a Cu plating method. The separation wall 150 was constituted of the plurality of striped parts extending longitudinally and the plurality of striped parts extending transversely. The separation wall 150 had the openings in the locations corresponding to the respective light emitting parts. Further, each of the striped parts constituting the separation wall 150 had a rectangular cross-sectional shape having a width of about 10 µm and a thickness of about 4 µm. A height of the separation wall 150 from the upper surface of the reflective electrode 142 was about 5 µm.

Subsequently, in the same procedure as that in Example 1, the organic EL layer 160 was formed. The organic EL layer 160 was formed on the upper surface of the reflective electrode 142 and the upper surface of the separation wall 150, but not formed on any of the side surfaces of the separation wall 150. Then, in the same procedure as that in Example 1, the transparent electrode 170 was formed. The transparent electrode 170 was continuously formed on the upper surface of the organic EL layer and on the side and upper surfaces of the separation wall 150, and thereby electrically connected to the separation wall 150 formed of Cu.

Subsequently, the formation of the barrier layer 180; formation of the color filter substrate; bonding of the organic EL element substrate and the color filter substrate; and separation of the plurality of display parts were carried out in the same procedures as those in Example 1, to obtain a plurality of organic EL displays.

The organic EL display in, the present example also exhibited the same effect as that of the display in Example 1. It is considered that the same effect as that in Example 1 was obtained by the fact that the separation wall 150 was made of metal, and therefore moisture was not transferred from the separation wall 150 to the organic EL layer 160 in the present example, although the organic EL layer 160 was in contact with the bottom part of the separation wall 150. Furthermore, luminance unevenness was not noticeable, since the electrically conductive separation wall 150 made of Cu reduced wiring resistance of the transparent electrode 170.

Example 3

The present example is an example of the organic EL display of the second embodiment of the present invention. An organic EL display in the present example has a nominal size of 6 inches, and each pixel has a size of 100 µm×300 µm×RGB. Also, a color filter substrate was used, in which the black matrix 220 and three types of color filters 230 were formed on the sealing substrate 210.

First, in the same procedure as that in Example 1 except that the size of each pixel was changed, the layers including and below the inorganic passivation layer 132 were formed. Subsequently, an IZO film was fanned by a sputtering method and patterned in the same procedure as that in Example 1, to form the underlying layer 141 constituted of the plurality of parts separated for each of the sub pixels, and the underlying layer 144 for auxiliary wiring constituted of the plurality of striped parts having a width of 16 µm in gaps between transversely adjacent sub pixels. Each of the striped parts of the underlying layer 144 for auxiliary wiring extended to the outer circumferential part of the display part along the longitudinally arranged sub pixel line, and was connected to the power supply line provided in the outer circumferential part of the display part.

Then, an Ag alloy film having a film thickness of 200 nm was formed by a sputtering method so as to cover the underlying layer 141, and patterned by a similar process, to form the reflective electrode 142 constituted of the plurality of parts and the auxiliary wiring 145 constituted of the plurality of striped parts. Each of the plurality of parts constituting the reflective electrode 142 was arranged so as not to protrude beyond the underlying layer 141. In the same manner, each of the striped parts of the auxiliary wiring 145 was arranged so as not to protrude beyond the underlying layer 144 for auxiliary wiring.

Then, a polyimide-based photosensitive resin film having a film thickness of 1 µm was formed by a spin coat method, and then patterned by a photolithography method, to form the insulating film 143. The insulating film 143 had the openings having a size of transversely 60 µm×longitudinally 270 µm on the reflective electrode 142, and the longitudinally extending striped openings on the auxiliary wiring 145. A stacked body in which the insulating film 143 had been formed was baked at about 250° C. to sufficiently discharge off outgas such as moisture.

Then, photosensitive resin (manufactured by Hitachi chemical, CR-600) was applied and patterned by a photolithography method, to form the separation wall 150 constituted of the plurality of striped parts extending longitudinally and the plurality of striped parts extending transversely. The separation wall 150 had the opening in the locations corresponding to the respective light emitting parts. Each of the striped parts of the separation wall 150 had a reverse tapered (reverse trapezoidal shaped) cross section having an upper bottom of about 14 µm, lower bottom of about 6 µm, and height of about 7 µm from the electrode surface. Here, the opening parts provided in the insulating film 143 on the auxiliary wiring 145 were positioned below the upper surface of the separation wall 150. The resultant separation wall 150 was baked at about 220° C. to discharge off outgas such as moisture. By this operation, the separation wall 150 having a transverse opening width of about 86 µm with respect to a transverse sub pixel pitch of 100 µm was obtained.

Subsequently, the organic EL layer 160 was formed by the same procedure as that in Example 1. The organic EL layer 160 was separated for each of the light emitting parts by the separation wall 150, in the same manner as that in Example 1. Further, the organic EL layer 160 was not in contact with any of the side surfaces of the separation wall 150, or completely left any of the openings of the insulating film 143 on the auxiliary wiring 145 unblocked.

Then, the transparent electrode 170 was formed by the same procedure as that in Example 1. At this time, the transparent electrode 170 was formed along the side surfaces of the separation wall 150, in addition to the upper surface of the organic EL layer 160 and the upper surface of the separation wall 150. Thereby, the transparent electrode 170 was connected to the auxiliary wiring 145 through the opening parts of the insulating film 143.

Subsequently, the formation of the barrier layer 180; formation of the color filter substrate; bonding of the organic EL element substrate and the color filter substrate; and separation of the plurality of display parts were carried out in the same procedures as those in Example 1, to obtain a plurality of organic EL displays.

The organic EL display in the present example also exhibited the same effect as that of the display in Example 1. Also, even though the display was enlarged in size, luminance unevenness was not noticeable, due to reduction of the wiring resistance of the transparent electrode 170 by the auxiliary wiring 145.

Example 4

The present example is an example of the organic EL display of the third embodiment of the present invention. An organic EL display in the present example has a nominal size of 3 inches, and each pixel has a size of 60 µm×180 µm×RGB. Also, a color filter substrate, in which the black matrix 220 and three types of color filters 230 were formed on the sealing substrate 210, was used.

First, the layers including and below the inorganic passivation layer 132 were formed by the same procedure as that in Example 1.

Then, photosensitive resin (manufactured by Hitachi chemical, CR-600) was applied and patterned by a photolithography method, to form the separation wall 150 constituted of the plurality of striped parts that extended longitudinally. The striped parts of the separation wall 150 were positioned in gaps between the light emitting part lines that extended longitudinally. Each of the striped parts of the separation wall 150 had a reverse tapered (reverse trapezoidal shaped) cross section having an upper bottom of about 10 µm, lower bottom of about 6 µm, and height of about 5 µm from the electrode surface. The resultant separation wall 150 was baked at about 220° C. to discharge off outgas such as moisture. By this operation, the separation wall 150 having a transverse opening width of about 50 µm with respect to a transverse sub pixel pitch of 60 µm was obtained.

Subsequently, the organic EL layer 160 was formed by the same procedure as that in Example 1. The organic EL layer 160 was formed on the upper surface of the reflective electrode 142 and the upper surface of the separation wall 150, but not formed on any of the side surfaces of the separation wall 150. The organic EL layer 160 in the present example was constituted of the plurality of striped parts that extended longitudinally.

Then, a stacked body, in which the organic EL layer 160 had been formed, was moved into another chamber of the resistive heating vapor deposition device to form an MgAg film having a film thickness of about 30 nm. The MgAg film was positioned on the organic EL layer 160, and separated into: the transparent electrode 170 consisting of the plurality of striped parts extending longitudinally; and the MgAg film 171 formed on the separation wall 150.

Subsequently, the formation of the barrier layer 180; formation of the color filter substrate; bonding of the organic EL element substrate and the color filter substrate; and separation of the plurality of display parts were carried out in the same procedures as those in Example 1, to obtain a plurality of organic EL displays.

The organic EL display in the present example also exhibited the same effect as that of the display in Example 1.

What is claimed is:

1. An organic electro-luminescent (EL) display comprising:
   a substrate;
   a reflective electrode and an auxiliary wiring on the substrate, the reflective electrode and the auxiliary wiring being spaced apart from each other;
   an insulating film on the reflective electrode and the auxiliary wiring, the insulating film comprising a first opening to open at least a portion of the reflective electrode and a second opening to open at least a portion of the auxiliary wiring;
   an organic EL layer on the reflective electrode to contact the at least a portion of reflective electrode through the first opening, the organic EL layer being insulated from the auxiliary wiring;
   a separation wall on the insulating film, the separation wall being provided such that the at least a portion of the auxiliary wiring is exposed through the second opening;
   a transparent electrode on the organic EL layer, the transparent electrode connected with the at least a portion of the auxiliary wiring through the second opening;
   a barrier layer on the transparent electrode; and
   a color conversion layer on the barrier layer,
   wherein:
      the reflective electrode is constituted of a plurality of partial electrodes;
      the organic EL layer is constituted of a plurality of parts that are separated by the separation wall;
      the barrier layer covers the separation wall and the transparent electrode, and has a recessed part in a location corresponding to the reflective electrode; and
      the color conversion layer is formed in the recessed part.

2. The organic EL display according to claim 1, wherein:
   the separation wall has a plurality of openings respectively corresponding to the plurality of partial electrodes that constitute the reflective electrode; and
   the organic EL layer is formed in the plurality of openings.

3. The organic EL display according to claim 1, wherein:
   the separation wall is constituted of a plurality of first striped parts, each of the plurality of the first striped parts being arranged in respective gaps between the plurality of partial electrodes constituting the reflective electrode and extend in one direction; and
   the organic EL layer is formed in a gap of the separation wall.

4. The organic EL display according to claim 3, wherein the transparent electrode is constituted of a plurality of second striped parts that are separated by the separation wall.

5. The organic EL display according to claim 4, wherein applied voltage is individually controlled for each of the plurality of striped parts of the transparent electrode.

6. The organic EL display according to claim 4, wherein an electrical characteristic can be measured for each of the plurality of striped parts of the transparent electrode.

7. The organic EL display according to claim 1, wherein the reflective electrode and the auxiliary wiring are formed of a same material on a same layer.

8. The organic EL display according to claim 1, further comprising a first underlying layer under the reflective electrode and a second underlying layer under the auxiliary wiring, each of the first underlying layer and the second underlying layer being formed of a same conductive material on a same layer.

9. The organic EL display according to claim 1, wherein the insulating film covers a shoulder part of the reflective electrode to form the first opening and a shoulder part of the auxiliary wiring to form the second opening.

10. The organic EL display according to claim 1, wherein the organic EL layer is further provided between an upper surface of the separation wall and a lower surface of the transparent electrode.

11. The organic EL display according to claim 1, wherein the transparent electrode is further provided on upper and side surfaces of the separation wall, and the plurality of parts of the organic EL layer is not in contact with the separation wall by the transparent electrode.

12. The organic EL display according to claim 1, wherein the separation wall comprises a metallic material.

13. The organic EL display according to claim 1, wherein the separation wall has a height of about 1.5 μm to 3 μm for a separation of the organic EL layer and a connection of the auxiliary wiring with the transparent electrode.

14. The organic EL display according to claim 1, wherein the barrier layer has a refraction index equivalent to that of the transparent electrode, and the color conversion layer has a refraction index equal to or more than that of the barrier layer.

15. The organic EL display according to claim 1, further comprising a protective layer provided on the color conversion layer to prevent the color conversion layer from being deteriorated.

16. The organic EL display according to claim 1, further comprising a sealing substrate to face the substrate and a spacer between the substrate and the sealing substrate, wherein the sealing substrate comprises a color filter and a black matrix, and the spacer is provided on an upper surface of the barrier layer.

17. The organic EL display according to claim 16, wherein the sealing substrate and the substrate are bonded in a circumferential edge part to form a bonding gap between the sealing substrate and the substrate, and material having a refractive index of 1.3 or more is filled in the bonding gap.

18. The organic EL display according to claim 1, further comprising an insulating film barrier layer covering the insulating film to prevent outgas from penetrating from the insulating film into the organic EL layer.

* * * * *